United States Patent
Imoto et al.

(10) Patent No.: US 11,561,259 B2
(45) Date of Patent: Jan. 24, 2023

(54) OPEN CIRCUIT VOLTAGE MEASURING METHOD, OPEN CIRCUIT VOLTAGE MEASURING DEVICE, AND RECORDING MEDIUM RECORDING PROGRAM

(71) Applicant: Panasonic Intellectual Property Corporation of America, Torrance, CA (US)

(72) Inventors: Junichi Imoto, Osaka (JP); Ryuji Sakata, Osaka (JP); Kohsuke Yoshioka, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 309 days.

(21) Appl. No.: 16/891,891

(22) Filed: Jun. 3, 2020

(65) Prior Publication Data

US 2020/0386815 A1 Dec. 10, 2020

(30) Foreign Application Priority Data

Jun. 6, 2019 (JP) .............................. JP2019-105876

(51) Int. Cl.
*G06F 11/30* (2006.01)
*G01R 31/367* (2019.01)
*G01R 31/385* (2019.01)

(52) U.S. Cl.
CPC ......... *G01R 31/367* (2019.01); *G01R 31/385* (2019.01)

(58) Field of Classification Search
CPC ........................... G01R 31/367; G01R 31/385
See application file for complete search history.

(56) References Cited

U.S. PATENT DOCUMENTS

2019/0308630 A1 * 10/2019 K ........................... B60W 50/14

FOREIGN PATENT DOCUMENTS

JP 09-243716 9/1997

* cited by examiner

*Primary Examiner* — Phuong Huynh
(74) *Attorney, Agent, or Firm* — Greenblum & Bernstein, P.L.C.

(57) ABSTRACT

To detect connection between a secondary battery and a charger, determine whether or not a state of the secondary battery is stabilized in a case of detecting the connection, measure a first open circuit voltage that is an open circuit voltage before charging of the secondary battery in a case of determining that a state of the secondary battery is stabilized, instruct the charger to start charging of the secondary battery, detect end of charging of the secondary battery, determine whether or not a state of the secondary battery is stabilized in a case of detecting end of charging of the secondary battery, measure a second open circuit voltage that is an open circuit voltage after charging of the secondary battery in a case of determining that a state of the secondary battery is stabilized, and notify the user of end of charging of the secondary battery.

10 Claims, 8 Drawing Sheets

| BATTERY ID | TIME STAMP | STATE | VALUE |
|---|---|---|---|
| AAA | 19:10 MAY 1, 2019 | END OF CHARGING | (VOLTAGE, CURRENT, TEMPERATURE) |
| AAA | 21:10 MAY 1, 2019 | MEASUREMENT OF FIRST OCV | (VOLTAGE, CURRENT, TEMPERATURE) |
| AAA | 21:10 MAY 1, 2019 | START OF CHARGING | (VOLTAGE, CURRENT, TEMPERATURE) |
| AAA | 2:10 MAY 2, 2019 | END OF CHARGING | (VOLTAGE, CURRENT, TEMPERATURE) |
| AAA | 5:10 MAY 2, 2019 | MEASUREMENT OF SECOND OCV | (VOLTAGE, CURRENT, TEMPERATURE) |
| AAA | 7:10 MAY 2, 2019 | START OF DISCHARGING | (VOLTAGE, CURRENT, TEMPERATURE) |
| ... | ... | ... | ... |

OPEN CIRCUIT VOLTAGE MEASURING METHOD, OPEN CIRCUIT VOLTAGE MEASURING DEVICE, AND RECORDING MEDIUM RECORDING PROGRAM

FIELD OF THE INVENTION

The present disclosure relates to a technique of measuring an open circuit voltage of a secondary battery.

BACKGROUND ART

In recent years, with the spread of electric vehicles, needs for accurately determining the life of a secondary battery have been increasing, and various techniques have been proposed. For example, Japanese Patent Application Laid-Open No. H09-243716 discloses a technique of determining the life of a secondary battery at the time of use by inputting parameters such as an open circuit voltage of the secondary battery to be determined to a learned neural network. In this document, parameters such as an open circuit voltage of a secondary battery used for leaning at a plurality of use lapse times am measured, the life of the secondary battery for learning at each use time is obtained, and parameters and the life at each of the use lapse times are provided to a neural network, so that learning of the neural network is performed.

However, in Japanese Patent Application Laid-Open No. 9-243716, although an open circuit voltage of a secondary battery to be determined is measured, a state of the secondary battery to be determined needs to be stable in order to measure an open circuit voltage. For this reason, in order to measure an open circuit voltage of a secondary battery to be determined in Japanese Patent Application Laid-Open No. 9-243716, the user is required to wait the start of charging after the end of discharging, or wait the use of the secondary battery after the end of charging. As a result, further improvement is required for Japanese Patent Application Laid-Open No. 9-243716 in order to measure an open circuit voltage of a secondary battery to be determined without giving any stress to the user.

SUMMARY OF THE INVENTION

An object of the present disclosure is to provide a technique of measuring an open circuit voltage of a secondary battery without causing stress to the user.

According to an aspect of the present disclosure, there is provided an open circuit voltage measuring method in an open circuit voltage measuring device that measures an open circuit voltage of a secondary battery. The method includes the steps of (a) detecting connection between the secondary battery and a charger, (b) determining whether or not a state of the secondary battery is stabilized in a case of detecting the connection, (c) measuring a first open circuit voltage that is an open circuit voltage before charging of the secondary battery in a case of determining that a state of the secondary battery is stabilized, (d) instructing the charger to start charging of the secondary battery, (e) detecting end of charging of the secondary battery, (f) determining whether or not a state of the secondary battery is stabilized in a case of detecting end of charging of the secondary battery, (g) measuring a second open circuit voltage that is an open circuit voltage after charging of the secondary battery in a case of determining that a state of the secondary battery is stabilized, and (h) notifying the user of end of charging of the secondary battery.

BRIEF DESCRIPTION OF THE DRAWINGS

FIG. 8 is a diagram showing an example of a data configuration of a log database.

DESCRIPTION OF EMBODIMENTS

Background of the Present Disclosure

Figure 1:
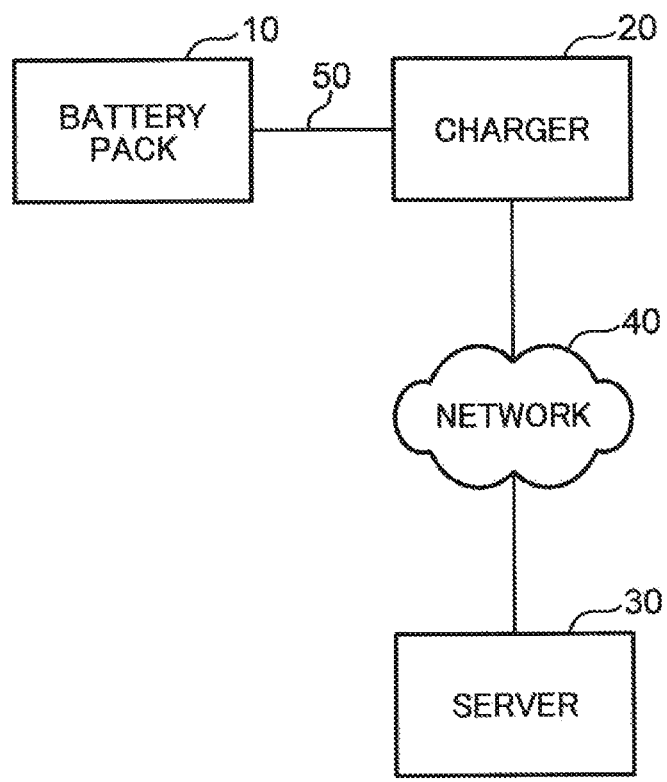
FIG. 1 is a block diagram showing an overall configuration of an open circuit voltage measuring device according to the present disclosure.

The present inventor studies the development of a machine learning model that calculates a charging state (state of charge; SOC), a deterioration state (state of health; SOH), and the like of a secondary battery, performs machine learning using an obtained value as correct data, and predicts various states of the secondary battery.

In order to measure SOC and SOH, it is necessary to accurately measure an open circuit voltage (OCV) of a secondary battery. An OCV, which indicates an open end voltage of a secondary battery in a stable state, cannot be measured immediately after discharging or immediately after charging, and it is necessary to stop use of a secondary battery without discharging and charging until the secondary battery reaches a stable state.

However, since it takes a long time (for example, two to three hours) for a secondary battery to reach a stable state, it is not easy to measure an OCV of a secondary battery in actual use. For example, in many cases, an electric vehicle starts to be charged immediately upon the user returning home in the evening, and starts to be used immediately after charging is completed the next morning.

Therefore, in order to measure an OCV of a secondary battery mounted on an electric vehicle, the user is required to wait for the secondary battery to reach a stable state after returning home, and connect a charger to the electric vehicle. This causes stress to the user. On the other hand, if the end of charging is notified to the user immediately after the end of charging the secondary battery, there is high possibility that the secondary battery is used by the user before the state of the secondary battery is stabilized. This makes it impossible to accurately measure an OCV after the end of charging. Therefore, in an electric vehicle, an OCV of a secondary battery is not measured in reality.

This similarly applies to mobile devices such as a notebook computer. For example, although a power cable of a mobile device is disconnected when the user is outdoors, a secondary battery is in a discharge state as the device is used as appropriate when the user is outdoors, and the secondary battery is unlikely to be in a stable state. Further, in many cases, a mobile device is connected to a power receiving cable immediately after the user returns from the outside. Therefore, it is practically difficult to measure an OCV even in a mobile device.

In the above-mentioned Japanese Patent Application Laid-Open No. 9-243716, the life of a secondary battery to be determined is determined as an OCV of the secondary battery to be determined is input into a learned neural network. However, Japanese Patent Application Laid-Open No. 9-243716 does not disclose under what condition an OCV of a secondary battery to be determined is measured. Accordingly, in actual use, an OCV of a secondary battery to be determined cannot be measured without causing stress to the user in actual use.

In view of the above, the present inventor has perceived aspects described below to solve the above problems.

According to an aspect of the present disclosure, there is provided an open circuit voltage measuring method in an open circuit voltage measuring device that measures an open circuit voltage of a secondary battery. The method includes the steps of (a) detecting connection between the secondary battery and a charger, (b) determining whether or not a state of the secondary battery is stabilized in a case of detecting the connection, (c) measuring a first open circuit voltage that is an open circuit voltage before charging of the secondary battery in a case of determining that a state of the secondary battery is stabilized, (d) instructing the charger to start charging of the secondary battery, (e) detecting end of charging of the secondary battery, (f) determining whether or not a state of the secondary battery is stabilized in a case of detecting end of charging of the secondary battery, (g) measuring a second open circuit voltage that is an open circuit voltage after charging of the secondary battery in a case of determining that a state of the secondary battery is stabilized, and (h) notifying the user of end of charging of the secondary battery.

According to the present configuration, in a case where connection of the charger is detected, charging of the secondary battery is not started immediately, but after waiting until a state of the secondary battery is stabilized. With the above, the present configuration can accurately measure the first open circuit voltage without making the user wait for the connection of the charger until the state of the secondary battery is stabilized.

Furthermore, according to the present configuration, in a case where the charging of the secondary battery is completed, the user is not notified of the completion of charging of the secondary battery immediately, but the user is notified of the completion of charging of the secondary battery after the state of the secondary battery is stabilized. In this manner, the present configuration can suppress the user from starling to use the secondary battery before the state of the secondary battery is stabilized after the end of charging, and can accurately measure the second open circuit voltage. As described above, according to the present configuration, an open circuit voltage can be accurately measured without causing stress to the user.

The above aspect may further include the steps of predicting a first time at which the measurement of the second open circuit voltage shown in the step (g) ends based on remaining capacity of the secondary battery in a case of detecting connection between the charger and the secondary battery, acquiring a use history of the user for the secondary battery, predicting a second time at which the user starts using the secondary battery after detecting connection to the charger based on the use history, and executing the processing of the steps (b), (c), (f), (g), and (h) in a case where the first time is earlier than the second time.

According to the present configuration, in a case where the measurement of the second open circuit voltage is not completed by the predicted second time at which the user starts using the secondary battery, the processing of the steps (b), (c), (f), (g), and (h) is not executed. In this manner, execution of a series of processing for measuring an open circuit voltage can be prevented for the user for whom measurement of an open circuit voltage does not match with the life cycle.

In the above aspect, the configuration may be such that the first open circuit voltage and the second open circuit voltage are used for learning a predetermined machine learning model, and the processing of the steps (b). (c), (f), (g), and (h) is executed until learning of the machine learning model ends.

According to the present configuration, when the learning of the predetermined machine learning model is completed, a series of processing for measuring an open circuit voltage is not executed. Accordingly, time required until charging of the secondary battery is completed after the secondary battery is connected to the charger can be reduced.

In the above aspect, the first open circuit voltage and the second open circuit voltage may be further output.

According to this configuration, since the first open circuit voltage and the second open circuit voltage are output, data useful for learning a machine learning model can be output.

In the above aspect, the configuration may be such that a state of the secondary battery is determined to be stabilized in a case where a first predetermined period of time has elapsed since end of discharging of the secondary battery is detected in the step (b), and a state of the secondary battery is determined to be stabilized in a case where a second predetermined period of time has elapsed since end of charging of the secondary battery is detected in the step (f).

According to the present configuration, in a case where a predetermined period of time has elapsed since connection of the charger is detected, the state of the secondary battery is determined to be stabilized, and, in a case where a predetermined period of time has elapsed since the end of charging of the secondary battery is detected, the state of the secondary battery is determined to be stabilized. For this reason, determination as to whether or not the state of the secondary battery is stabilized can be performed by simple processing.

In the above aspect, the configuration may be such that a state of the secondary battery is determined to be stabilized in a case where a voltage change of the secondary battery is equal to or less than a voltage threshold in the steps (b) and (f).

According to the present configuration, in a case where a voltage change of the secondary battery becomes equal to or less than the threshold, the state of the secondary battery is determined to be stabilized. Therefore, determination as to whether or not the state of the secondary battery is stabilized can be performed accurately.

In the above aspect, in a case where start of charging is instructed in the step (d), the charger may start supplying power to the secondary battery.

According to the present configuration, even if connection of the charger is detected, the secondary battery is not energized until start of charging is instructed, so that the first open circuit voltage can be accurately measured.

In the above aspect, the secondary battery may be mounted on an electric vehicle.

According to the present configuration, the first open circuit voltage and the second open circuit voltage, which have conventionally been difficult to measure in an electric vehicle, can be measured accurately.

The present disclosure can be realized as an open circuit voltage measuring device that executes characteristic configurations included in such an open circuit voltage measuring method and a program that causes a computer to execute characteristic configurations included in such an open circuit voltage measuring method. Further, it goes without saying that such a program can be distributed via a computer-readable non-transitory recording medium, such as a CD-ROM, or a communication network, such as the Internet.

Note that all embodiments described below show one specific example of the present disclosure. Numerical values, shapes, constituents, steps, order of steps, and the like described in the embodiments below are merely examples, and are not intended to limit the present disclosure.

Further, among the constituents in the embodiments below, constituents not described in an independent claim indicating the highest concept are described as optional constituents. Further, in all the embodiments, the content of each can be combined with one another.

Embodiment

Figure 3:
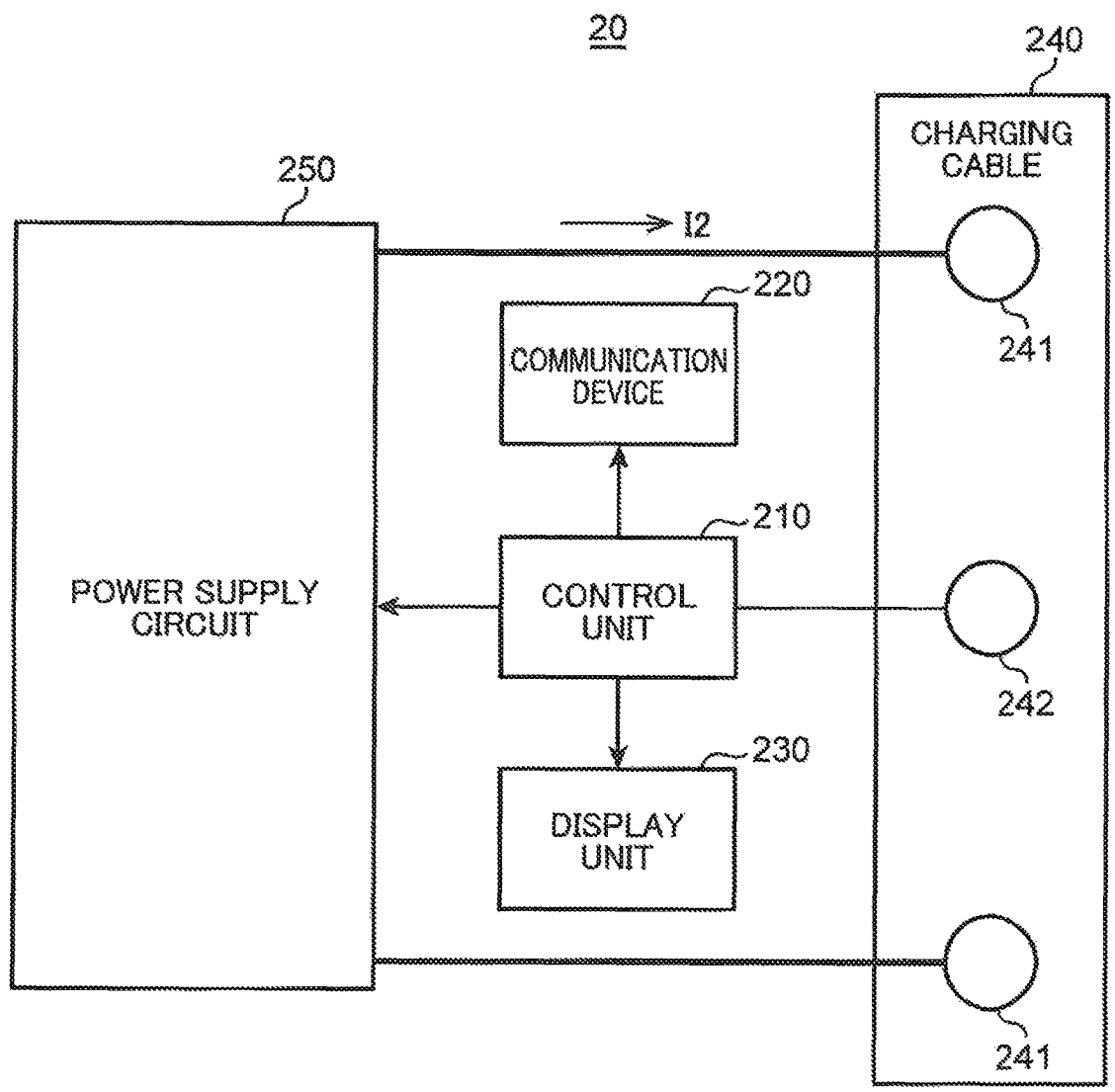
FIG. 3 is a block diagram showing an example of a configuration of a charger.

FIG. 1 is a block diagram showing an overall configuration of an open circuit voltage measuring device according to the present disclosure. The open circuit voltage measuring device includes a battery pack 10, a charger 20, and a server 30. The battery pack 10 and the charger 20 are communicably connected via a communication path 50. The communication path 50 is a communication path according to a predetermined communication standard for communication between the battery pack 10 and the charger 20. The communication path 50 is, for example, a wire provided in a charging cable 240 (FIG. 3). However, this is an example, and the communication path 50 may be wireless. The communication path 50 may be, for example, a USB, a Bluetooth (registered trademark), a wired LAN, or a wireless LAN.

The charger 20 and the server 30 are communicably connected via a network 40. The network 40 is, for example, the Internet.

The battery pack 10 is mounted on, for example, a vehicle. The vehicle is, for example, an electric vehicle. However, this is only an example, and the vehicle may be, for example, a hybrid vehicle. The battery pack 10 includes a secondary battery 190 (see FIG. 2) serving as a power source of the vehicle. The battery pack 10 communicates with the server 30 via the charger 20. However, this is an example, and in a case where the battery pack 10 includes a communication device connectable to the network 40, the battery pack 10 may directly communicate with the server 30 without passing through the charger 20.

The charger 20 charges the secondary battery 190 by supplying power from commercial power to the battery pack 10. The charger 20 is installed, for example, at the home of an owner of the vehicle on which the battery pack 10 is mounted. Note that, in a case where the vehicle is owned by an organization such as a company, the charger 20 may be installed in a building of the organization.

The server 30 is configured with, for example, one or more computers. The server 30 acquires log data transmitted from the battery pack 10 and builds a log database 321 (see FIG. 4). In this manner, the server 30 manages the battery pack 10. The server 30 can transmit various commands to the battery pack 10 and control the battery pack 10.

Although one of the battery pack 10 and one of the charger 20 are shown in FIG. 1, this is an example, and the open circuit voltage measuring device may include a plurality of the battery packs 10 and a plurality of the chargers 20. In this case, the server 30 manages each of the battery packs 10 and each of the chargers 20 individually using an identifier of each of the battery packs 10 and an identifier of each of the chargers 20 via the network 40.

Figure 2:
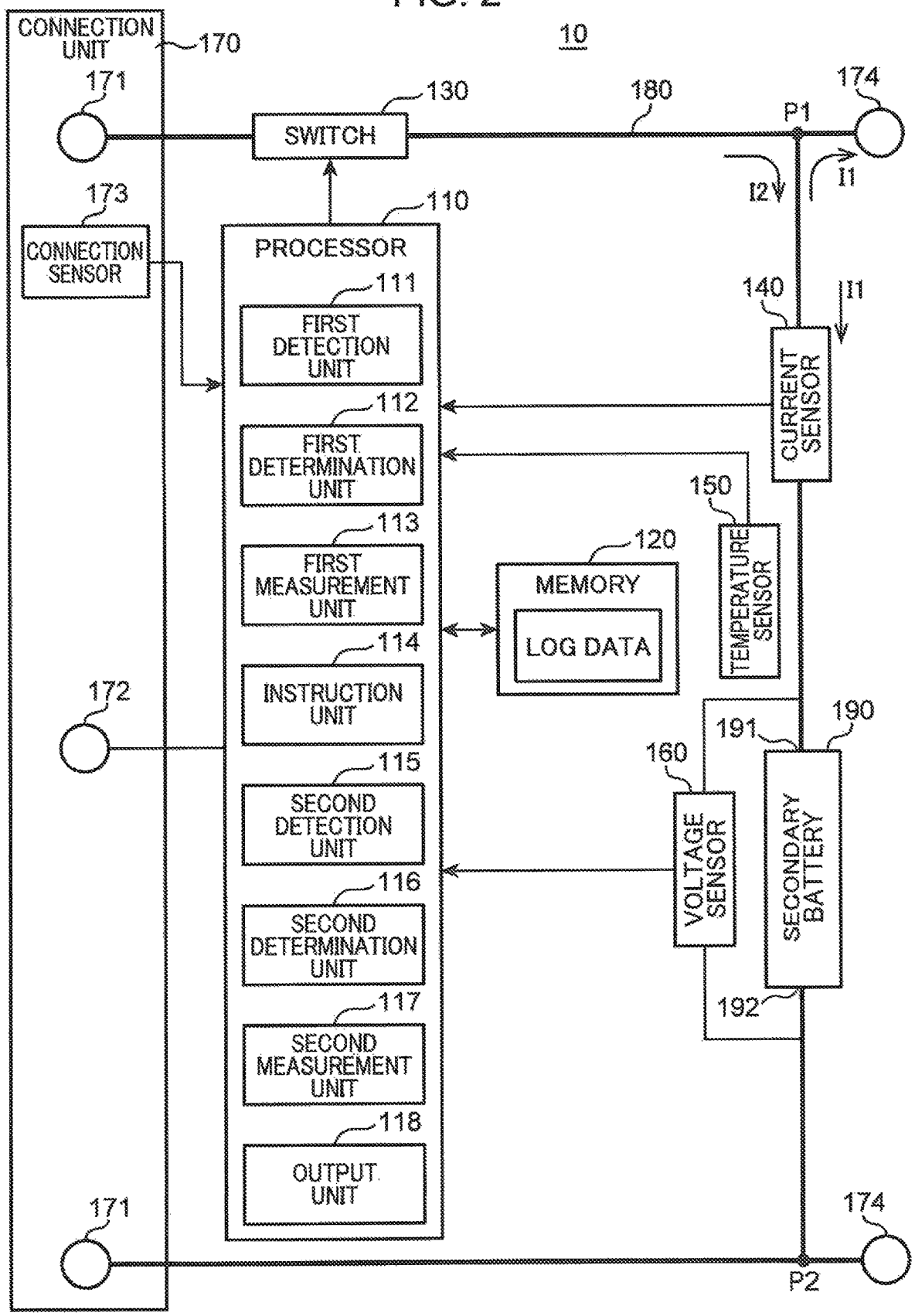
FIG. 2 is a block diagram showing an example of a configuration of a battery pack shown in FIG. 1.

FIG. 2 is a block diagram showing an example of a configuration of the battery pack 10 shown in FIG. 1. The battery pack 10 includes a processor 110, a memory 120, a switch 130, a current sensor 140, a temperature sensor 150, a voltage sensor 160, a connection unit 170, a pair of discharge terminals 174, a power line 180, and a secondary battery 190.

The processor 110 is, for example, an electric circuit such as a CPU, an ASIC, and an FPGA. The processor 110 includes a first detection unit 111, a first determination unit 112, a first measurement unit 113, an instruction unit 114, a second detection unit 115, a second determination unit 116, a second measurement unit 117, and an output unit 118. Each of the first detection unit 111 to the output unit 118 may be configured by a dedicated electric circuit, or may be realized by a CPU executing a predetermined program.

The first detection unit 111 detects whether or not the charger 20 is connected to the secondary battery 190 by detecting whether or not the charging cable 240 (FIG. 3) of the charger 20 is connected to the battery pack 10. Specifically, in a case of acquiring sensing data indicating that the charging cable 240 is connected from the connection sensor 173, the first detection unit 111 determines that the charger 20 is connected to the secondary battery 190, and in a case of acquiring sensing data indicating that the charging cable 240 is removed from the connection sensor 173, the first detection unit 111 determines that the charger 20 is removed from the secondary battery 190.

In a case where the first detection unit 111 detects that the charger 20 is connected to the secondary battery 190, the first determination unit 112 determines whether or not the state of the secondary battery 190 is stabilized. Specifically, the first determination unit 112 preferably determines that the state of the secondary battery 190 is stabilized in a case where a first predetermined period of time has elapsed since detection of the end of the discharge of the secondary battery 190. Here, the first predetermined period of time is, for example, a time period during which the state of the secondary battery 190 is expected to be stable after the discharge of the secondary battery 190 is completed, and is a time period determined in advance based on the specifications of the secondary battery 190 and the like. The state of the secondary battery 190 is, for example, a voltage state and/or a current state of the secondary battery 190. For example, in a case where the current sensor 140 detects that a discharge current I1 flowing through the power line 180 becomes equal to or less than a predetermined current threshold (for example, 0), the first determination unit 112 preferably determines that the discharge of the secondary battery 190 is completed.

Alternatively, the first determination unit 112 may determine that the state of the secondary battery 190 is stabilized in a case where a voltage change of the secondary battery 190 becomes equal to or less than a predetermined voltage threshold. Here, assume that voltage sensor 160 detects a voltage value of the secondary battery 190 at a predetermined sampling cycle and outputs the voltage value to the processor 110. In this case, the first determination unit 112 preferably calculates a difference voltage for each sampling cycle of a voltage value detected by the voltage sensor 160 after detecting the end of the discharge, and determines that the state of the secondary battery 190 is stabilized when the difference voltage becomes equal to or less than the voltage threshold.

In a case where the first determination unit 112 determines that the state of the secondary battery 190 is stabilized, the first measurement unit 113 measures a first open circuit voltage (hereinafter, referred to as the first OCV) which is an open circuit voltage before charging of the secondary battery 190. In this case, the first measurement unit 113 preferably measures the first OCV by acquiring a voltage value detected by the voltage sensor 160 from the voltage sensor 160 when the first determination unit 112 determines that the state of the secondary battery 190 is stabilized.

An OCV is a voltage of the secondary battery 190 when a pair of charging terminals 171 constituting the connection unit 170 is in an open state, and is, for example, a voltage of the secondary battery 190 in a state where the secondary battery 190 is not energized. In order to accurately measure the OCV, the state of the secondary battery 190 needs to be stable. After the discharge is completed, it takes several hours (for example, two to three hours) for the secondary battery 190 to reach a stable state. In view of the above, in the present embodiment, the first measurement unit 113 measures the first OCV after the discharge is completed and after waiting for the state of secondary battery 190 to be stabilized.

The instruction unit 114 instructs the charger 20 to start charging the secondary battery 190. In this case, the instruction unit 114 preferably causes the charger 20 to start charging by transmitting a charge start command to the charger 20 via a communication terminal 172.

Further, the instruction unit 114 outputs a control command to turn on the switch 130 to the switch 130 when transmitting the charge start command. In this manner, the charger 20 and the secondary battery 190 are electrically connected, and charging of the secondary battery 190 is started.

The second detection unit 115 detects the end of charging of the secondary battery 190. In the present embodiment, the secondary battery 190 is charged by, for example, constant current constant voltage (CCCV) charging. The CCCV charging is a charging system, in which constant current charging (CC charging) is performed until the voltage of the secondary battery 190 reaches a predetermined set voltage, and constant voltage charging (CV charging) is performed after the voltage of the secondary battery 190 reaches the set voltage. In CCCV charging, a charge current I2 decreases as the secondary battery 190 approaches a fully charged state. In view of the above, in a case where the charge current I2 becomes equal to or less than the predetermined current threshold, the second detection unit 115 preferably determines that the charging of the secondary battery 190 is completed.

Here, the secondary battery 190 is described as being charged by the CCCV charging. However, this is merely an example, and various charging methods such as trickle charging or CC charging may be employed. In this case, the first measurement unit 113 preferably determines that the charging of the secondary battery 190 is completed if the current and/or voltage of the secondary battery 190 satisfies a charge end condition according to various charging methods.

In a case where the second detection unit 115 detects the end of charging of the secondary battery 190, the second determination unit 116 determines whether or not the state of the secondary battery 190 is stabilized. The second determination unit 116 may determine whether or not the state of the secondary battery 190 is stabilized using a manner similar to that of the first determination unit 112. Specifically, the second determination unit 116 preferably determines that the state of the secondary battery 190 is stabilized in a case where a second predetermined period of time has elapsed since the second detection unit 115 detects the end of the charging of the secondary battery 190. The second predetermined period of time is, for example, a time period during which the state of the secondary battery 190 is expected to be stable after the charging of the secondary battery 190 is completed, and is a time period determined in advance based on the specifications of the secondary battery 190 and the like. The second predetermined period of time may be the same as the first predetermined period of time, or may be a time period different from the first predetermined period of time.

Alternatively, the second determination unit 116 may determine that the state of the secondary battery 190 is stabilized in a case where a voltage change of the secondary battery 190 becomes equal to or less than a predetermined voltage threshold, in a manner similar to that of the first determination unit 112.

In a case where the second determination unit 116 determines that the state of the secondary battery 190 is stable, the second measurement unit 117 measures a second OCV that is an OCV after charging of the secondary battery 190, and notifies the user of the end of charging of the secondary battery 190. The processing by which the second measurement unit 117 determines whether or not the state of the secondary battery 190 is stable is the same as that of the first measurement unit 113, and detailed description of the processing is omitted. The second measurement unit 117 preferably notifies the user of the end of charging by transmitting a charge end notification to the charger 20 via the communication terminal 172 and causing the charger 20 to output a charge end message. Furthermore, the second measurement unit 117 preferably causes the charger 20 to end charging by transmitting a charge end command to the charger 20 together with the charge end notification.

The output unit 118 outputs the first OCV and the second OCV. Specifically, the output unit 118 generates log data that associates a time stamp indicating a measurement time of the first OCV, a temperature of the secondary battery 190 detected by the temperature sensor 150 at the time of measurement of the first OCV, and an identifier of the battery pack 10. Furthermore, the output unit 118 generates log data that associates a time stamp indicating a measurement time of the second OCV, a temperature of the secondary battery 190 detected by the temperature sensor 150 at the time of measurement of the second OCV, and an identifier of the battery pack 10. Then, the output unit 118 transmits the generated log data to the charger 20 via the communication terminal 172, and causes the generated log data to be transmitted from the charger 20 to the server 30. In this manner, the output of the first OCV and the second OCV is performed. Furthermore, the output unit 118 may store the log data in the memory 120. Furthermore, the output unit 118 stores log data indicating the state of the secondary battery 190 that is periodically measured during discharging and charging in the memory 120.

The memory 120 is configured with, for example, a nonvolatile semiconductor memory such as a flash memory, and stores log data. In addition, the memory 120 may store a program for controlling the battery pack 10. When a data amount of the log data to be stored exceeds a predetermined amount, the memory 120 preferably deletes the log data in the order of older log data.

The switch 130 is, for example, a semiconductor switch or a relay switch. The switch 130 is provided on the power line 180. The switch 130 is turned on and off under the control of the processor 110. The switch 130 is turned on at the start of charging and turned off at the end of charging. In addition, the switch 130 is turned off in a case where the processor 110 detects abnormality or the like of the secondary battery 190 during energization.

The current sensor 140 is provided on the power line 180. The current sensor 140 is, for example, a current sensor including a shunt resistor, a current transformer type current sensor, or a Hall element type current sensor. The current sensor 140 measures the discharge current I1 and the charge current I2 flowing through the power line 180 at, for example, a predetermined sampling cycle, and outputs the measured currents to the processor 110. Note that the current sensor 140 detects the discharge current I1 as, for example, a positive value and the charge current I2 as, for example, a negative value. Therefore, the processor 110 can distinguish the discharge current I1 and the charge current I2 depending on whether the current value detected by the current sensor 140 is positive or negative.

The temperature sensor 150 is disposed in the vicinity of or in contact with the secondary battery 190, and measures the temperature of the secondary battery 190. The temperature sensor 150 measures the temperature of the secondary battery 190 at, for example, a predetermined sampling cycle, and outputs the temperature to the processor 110.

The voltage sensor 160 is, for example, a voltage sensor including a resistor. The voltage sensor 160 is connected in parallel with the secondary battery 190 between a positive electrode 191 and a negative electrode 192 of the secondary battery 190. The voltage sensor 160 measures the voltage of the secondary battery 190 at, for example, a predetermined sampling cycle, and outputs the voltage to the processor 110.

The connection unit 170 is a terminal to which the charging cable 240 is connected. The connection unit 170 includes a pair of the charging terminals 171, the communication terminal 172, and the connection sensor 173. A pair of the charging terminals 171 are connected to a pair of charging terminals 241 included in the charging cable 240. A pair of the charging terminals 171 supply the charge current I2 supplied from the charger 20 to the secondary battery 190. The communication terminal 172 is connected to a communication terminal 242 of the charging cable 240. The communication terminal 172 transmits a charge start command, a charge end command, a charge end notification, and the like to the charger 20.

The connection sensor 173 includes, for example, a switch. When the charging cable 240 is connected to the connection unit 170, and the switch is turned on, the connection sensor 173 outputs sensing data, indicating that the charging cable 240 is connected, to the processor 110. On the other hand, when the charging cable 240 is removed from the connection unit 170, and the switch is turned off the connection sensor 173 outputs sensing data, indicating that the charging cable 240 is removed, to the processor 110.

The power line 180 is connected between the positive electrode 191 of the secondary battery 190 and one of a pair of the charging terminals 171, and is connected between the negative electrode 192 of the secondary battery 190 and the other one of a pair of the charging terminals 171. Furthermore, the power line 180 branches at a branch point P1 between one of a pair of the charging terminals 171 and the positive electrode 191 and is connected to one of a pair of the discharge terminals 174. Furthermore, the power line 180 branches at a branch point P2 between the other one of a pair of the charging terminals 171 and the negative electrode 192 and is connected to the other one of a pair of the discharge terminals 174.

A load is connected to a pair of the discharge terminals 174. The load is, for example, an inverter and a motor.

The secondary battery 190 is a rechargeable battery such as a lithium ion battery, a nickel hydrogen battery, and a lead storage battery. The secondary battery 190 is supplied with power from the charger 20 during charging, and supplies power to the load during discharging.

FIG. 3 is a block diagram showing an example of a configuration of the charger 20. The charger 20 includes a control unit 210, a communication device 220, a display unit 230, a charging cable 240, and a power supply circuit 250. The control unit 210 is, for example, a computer including a CPU and a memory, and manages the overall control of the charger 20. Upon receiving a charge start command transmitted from the battery pack 10, the control unit 210 starts drive of the power supply circuit 250 and supplies the charge current I2 to the battery pack 10. Upon receiving a charge end command transmitted from the battery pack 10, the control unit 210 stops drive of the power supply circuit 250 and stops supply of the charge current I2 to the battery pack 10. Upon receiving a charge end notification transmitted from the battery pack 10, the control unit 210 displays a message notifying the end of charging on the display unit 230. On the other hand, in a case where connection between the charger 20 and the secondary battery 190 is detected in the battery pack 10, the control unit 210 may display a message notifying the start of charging on the display unit 230.

Note that, in a case where the display unit 230 includes a charging lamp indicating that charging is in progress, and the first detection unit 111 detects the connection, the control unit 210 may turn on the charging lamp, and, upon receiving a charge end notification, may turn off the charging lamp. Furthermore, in a case where the charger 20 includes a speaker, and the connection is detected by the first detection unit 111, the control unit 210 may output a voice message to start charging from the speaker, and, upon receiving a charge end notification, may output a voice message to end the charging from the speaker.

Furthermore, upon receiving log data transmitted from the battery pack 10, the control unit 210 transmits the log data to the server 30 using the communication device 220.

The communication device 220 is, for example, a communication circuit such as a modem, and communicably connects the charger 20 and the server 30 via the network 40.

The display unit 230 is, for example, a display device such as a liquid crystal panel, and displays a message indicating the end of charging, a message indicating the start of charging, and a message indicating that charging is being performed under the control of the control unit 210.

The charging cable 240 includes a power plug connected to a main body of the charger 20, a charging connector connected to the battery pack 10, and a cable connecting the power plug and the charging connector. The charging cable 240 electrically connects the battery pack 10 and the charger 20. The charging connector of the charging cable 240 includes a pair of the charging terminals 241 and the communication terminal 242. A pair of the charging terminals 241 are connected to a pair of the charging terminals 171 of the battery pack 10 when the charging cable 240 is connected to the connection unit 170 of the battery pack 10, and are disconnected from a pair of the charging terminals 171 of the battery pack 10 when the charging cable 240 is removed from the connection unit 170 of the battery pack 10. The communication terminal 242 is connected to the communication terminal 172 of the battery pack 10 when the charging cable 240 is connected to the connection unit 170 of the battery pack 10, and is disconnected from a pair of the communication terminals 172 of the battery pack 10 when the charging cable 240 is removed from the connection unit 170 of the battery pack 10.

The power supply circuit 250 is, for example, a converter that converts commercial AC power into DC power suitable for charging of the secondary battery 190. The power supply circuit 250 starts power supply to the battery pack 10 or stops power supply to the battery pack 10 under the control of the control unit 210.

Figure 4:
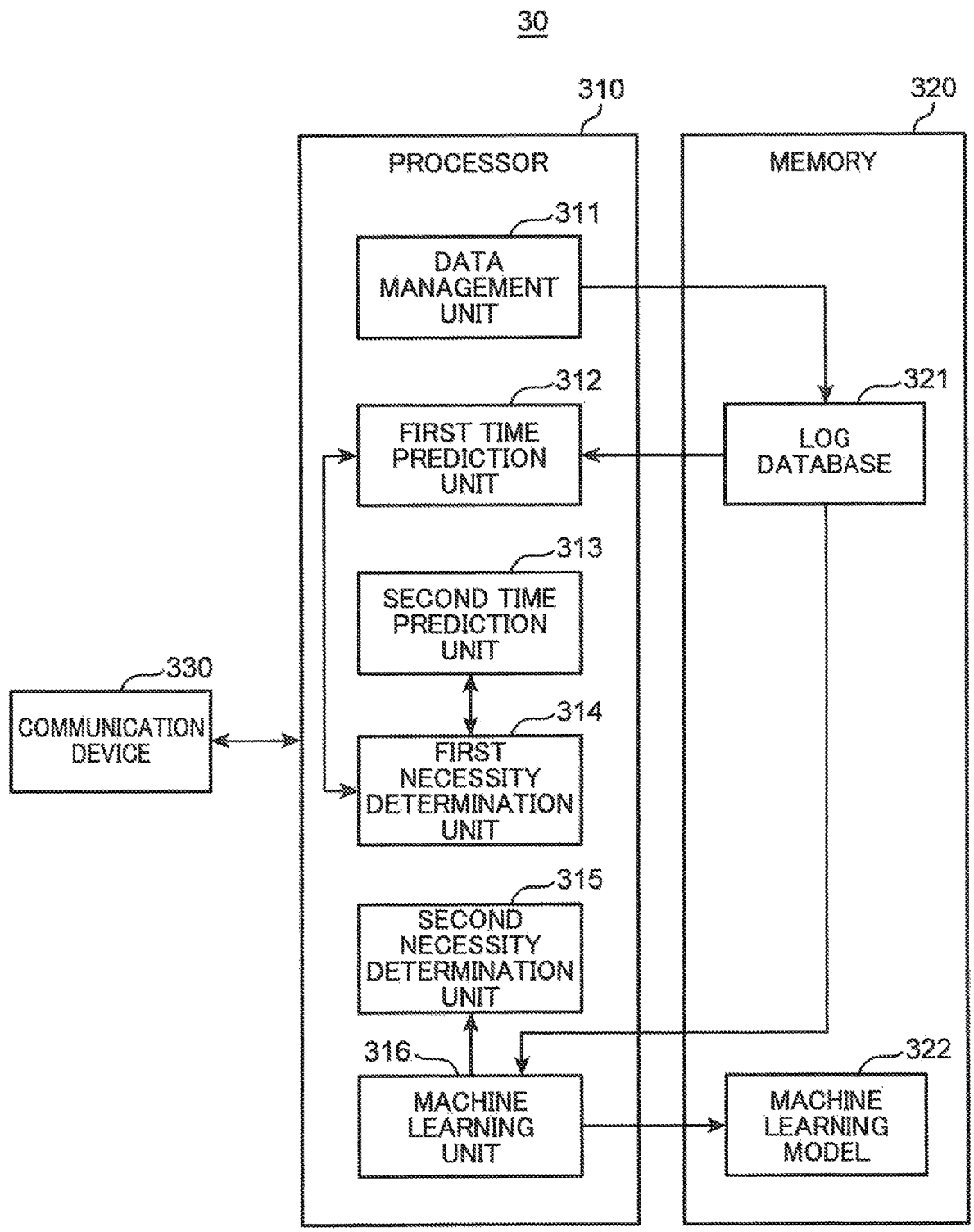
FIG. 4 is a block diagram showing an example of a configuration of a server.

FIG. 4 is a block diagram showing an example of a configuration of the server 30. The server 30 includes a processor 310, a memory 320, and a communication device 330. The processor 310 is an electric circuit such as a CPU, an ASIC, and an FPGA. The processor 310 includes a data management unit 311, a first time prediction unit 312, a second time prediction unit 313, a first necessity determination unit 314, a second necessity determination unit 315, and a machine learning unit 316.

The data management unit 311 manages the log database 321 by storing the log data received by the communication device 330 in the log database 321. Details of the log database 321 will be described later with reference to FIG. 8.

In a case where the connection of the charger 20 is detected by the first detection unit 111, the first time prediction unit 312 predicts a first time at which the measurement of the second OCV ends based on a remaining capacity of the secondary battery 190. An example of the details of the processing of the first time prediction unit 312 is as described below.

First, the first time prediction unit 312 acquires a voltage at the end of discharging of the target battery pack 10 stored in the log database 321 and inputs the acquired voltage into a predetermined function for calculating the remaining capacity according to the voltage so as to calculate the remaining capacity of the secondary battery 190. Next, the first time prediction unit 312 calculates required charging time by inputting the calculated remaining capacity into a predetermined function for calculating the required charging time according to the remaining capacity.

Next, the first time prediction unit 312 acquires a latest discharge end time of the target battery pack 10 from the log database 321. Next, the first time prediction unit 312 adds the first predetermined period of time required for the secondary battery 190 to reach a stable state after the end of discharging, the required charging time, and the second predetermined period of time required for the secondary battery 190 to reach a stable state after the end of charging, and calculates the obtained time as the first time.

The second time prediction unit 313 acquires a use history of the user for the target battery pack 10 from the log database 321 and, based on the acquired use history, predicts a second time at which the user starts use of the secondary battery 190 after connection between the secondary battery 190 and the charger 20 is detected.

An example of the details of the processing of the second time prediction unit 313 is as described below. See FIG. 8. First, the second time prediction unit 313 acquires log data of the state "discharge start" in a certain period in the past of the target battery pack 10 from the log database 321, which is log data immediately after the log data of the state "charge end". In the example of FIG. 8, the log data of the state "discharge start" in a six row from the top is log data of the state "discharge start" immediately after the state "charge end". Next, the second time prediction unit 313 obtains an average value of times indicated by time stamps of the acquired log data of the state "discharge start". Next, the second time prediction unit 313 determines the average value of the obtained times as the second time.

Note that the second time prediction unit 313 may predict the second time taking into account weekdays and holidays. For example, in a case where a day to which a time the secondary battery 190 is used next from a time at which the charger 20 and the secondary battery 190 are connected belongs is predicted to be a weekday, the second time prediction unit 313 uses log data of the state "discharge start" of a weekday from the log database 321 to determine the second time. On the other hand, in a case where a day to which a time the secondary battery 190 is used next from a time at which the charger 20 and the battery pack 10 are connected belongs is predicted to be a holiday, the second time prediction unit 313 uses log data of the state "discharge start" of a holiday from the log database 321 to determine the second time. Note that, the second time prediction unit 313 preferably determines a weekday and a holiday by using a day of the week when the day of the week is included in a time stamp, or identifies a day of the week of a year, month, and day indicated by a time stamp by referring to calendar information based on the year, month, and day indicated by the time stamp, and uses the day of the week to determine a weekday and a holiday.

See FIG. 4. In a case where the first time is earlier than the second time, that is, the OCV acquisition mode, which is a series of processing for acquiring the first OCV and the second OCV, is predicted to end before the user uses the vehicle, the first necessity determination unit 314 determines that execution of the OCV acquisition mode is possible. On the other hand, in a case where the first time is later than the second time, that is, the OCV acquisition mode is predicted not to end before the user uses the vehicle, the first necessity determination unit 314 determines that execution of the OCV acquisition mode is not possible.

The second necessity determination unit 315 determines that execution of the OCV acquisition mode is unnecessary in a case where the machine learning of a machine learning model 322 in the machine learning unit 316 is completed and the first OCV and the second OCV do not need to be acquired any mom. On the other hand, the second necessity determination unit 315 determines that execution of the OCV acquisition mode is necessary in a case where the machine learning of the machine learning model 322 in the machine learning unit 316 is not completed and the first OCV and the second OCV need to be acquired.

The machine learning unit 316 acquires log data including the first OCV and the second OCV from the log database 321, generates learning data such as SOC and SOH from the acquired log data, and provides the generated learning data to the machine learning model 322, so that the machine learning model 322 is learned. The machine learning unit 316 performs, for example, supervised learning. In a case where an error variation between an output value of the machine learning model 322 and correct data converges to a predetermined value or less, the machine learning unit 316 determines that the machine learning has ended, and inputs the fact to the second necessity determination unit 315. In this manner, the second necessity determination unit 315 can determine whether or not the machine learning of the machine learning model 322 has ended.

The memory 320 is, for example, a nonvolatile storage device such as a flash memory or a hard disk drive. The memory 320 stores the log database 321 and the machine learning model 322.

FIG. 8 is a diagram showing an example of a data configuration of the log database 321. The log database 321 includes columns of "Battery ID", "Time stamp", "State", and "Value". One row of the log database 321 corresponds to one piece of log data.

"Battery ID" is an identifier of the battery pack 10 to be managed by the server 30. Note that "Battery ID" may be an identifier of the secondary battery 190. "Time stamp" indicates the date and time of acquisition of log data. "State" is a state of the secondary battery 190 at the time of acquisition of log data. Here, "State" includes the end of charging, acquisition of the first OCV, the start of charging, acquisition of the second OCV, and the like. The end of charging indicates a state at the time of the end of charging of the secondary battery 190. The acquisition of the first OCV indicates the state of the secondary battery 190 at the time of measurement of the first OCV. The start of charging indicates a state at the time of start of charging of the secondary battery 190. The acquisition of the second OCV indicates the state of the secondary battery 190 at the time of measurement of the second OCV. In addition, "State" includes charging indicating a state where the secondary battery 190 is energized with the charge current I2, discharging indicating a state where the discharge current I1 is supplied from the secondary battery 190, and the like. Note that, although not shown in FIG. 8, the log database 321 stores log data indicating the state of the secondary battery 190 that is periodically measured during charging or discharging. Note that log data indicating the state of the secondary battery 190 that is periodically measured during discharging and charging may be transmitted from the battery pack 10 to the server 30 each time measurement is performed, or may be transmitted all at once at a predetermined timing from the battery pack 10 to the server 30 via the charger 20. The predetermined timing is, for example, at the end of discharging, at the end of charging, at the time of measurement of the first OCV, at the time of measurement of the second OCV, and the like.

"Value" is a value indicating a state of the secondary battery 190. Here, the "value" includes a voltage, a current, and a temperature. The voltage is a voltage value of the secondary battery 190 measured by the voltage sensor 160. The current is a current value of the secondary battery 190 measured by the current sensor 140. The temperature is a temperature of the secondary battery measured by the temperature sensor 150.

See FIG. 4. The machine learning model 322 is machine-learned using data such as SOC and SOH obtained from the first OCV and the second OCV as learning data. The machine learning model 322 is configured with, for example, a neural network or a support vector machine. The machine learning model 322 predicts the life of the secondary battery 190 based on, for example, SOC and SOH.

Figure 5:
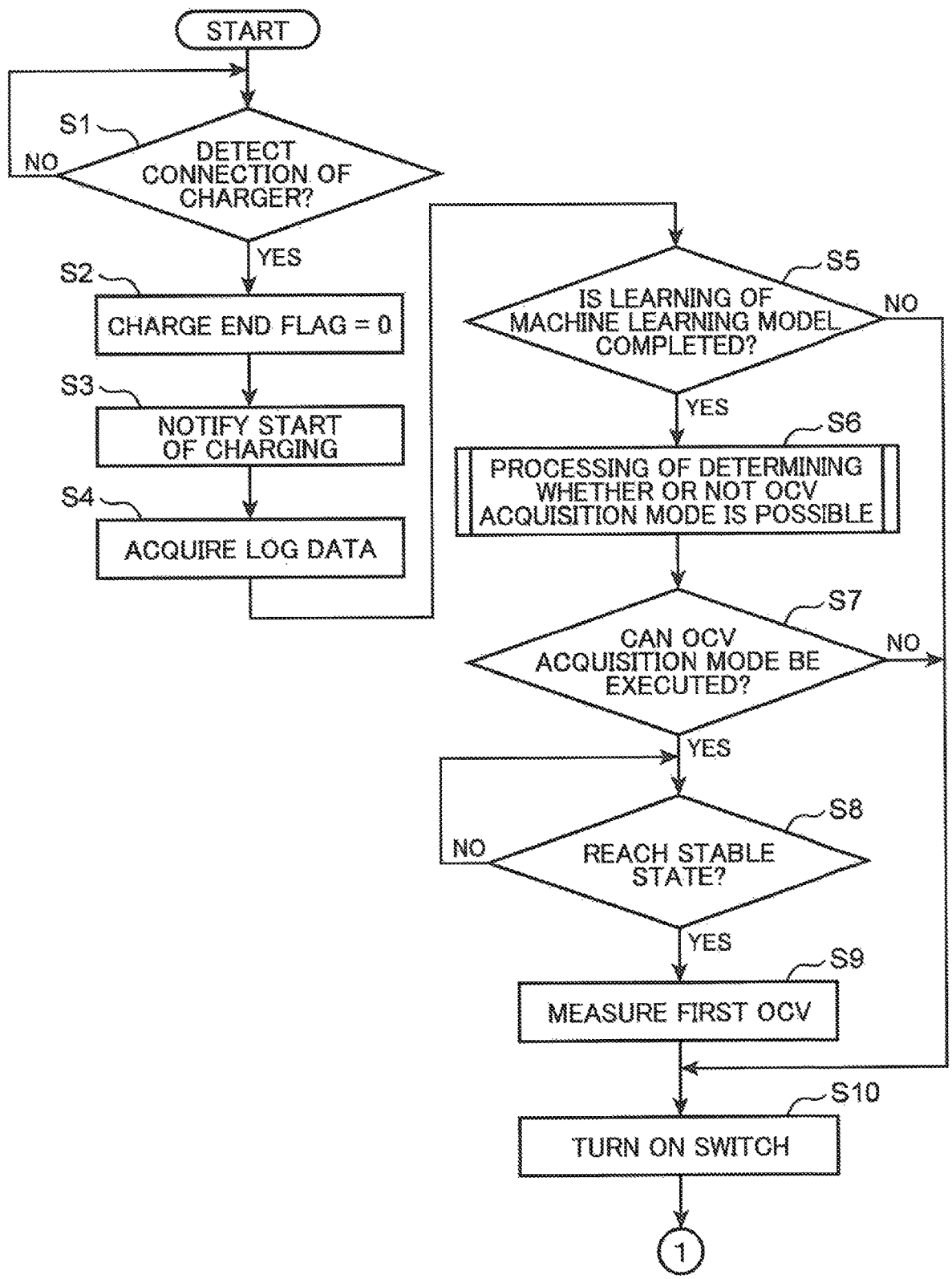
FIG. 5 is a flowchart showing an example of operation of the open circuit voltage measuring device according to an embodiment of the present disclosure.
Figure 6:
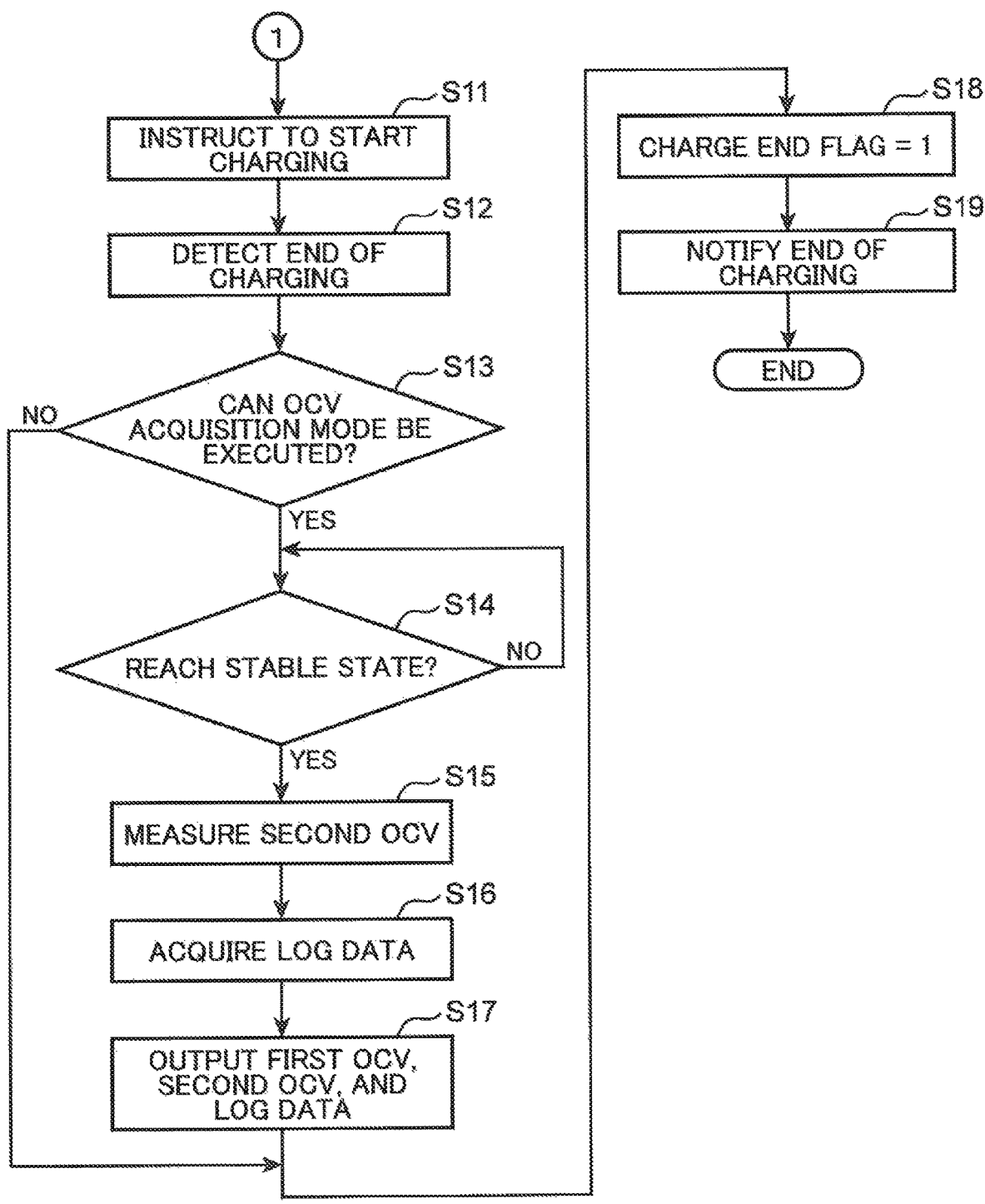
FIG. 6 is a flowchart following FIG. 5.

Next, the operation of the open circuit voltage measuring device will be described. FIG. 5 is a flowchart showing an example of operation of the open circuit voltage measuring device according to an embodiment of the present disclosure. FIG. 6 is a flowchart following FIG. 5. In step S1, the first detection unit 111 of the battery pack 10 detects that the charger 20 is connected to the secondary battery 190 from sensing data of the connection sensor 173. In a case where connection of the charger 20 is detected (YES in step S1), the processing proceeds to step S2, and, in a case where connection of the charger 20 is not detected (NO in step S1), the processing returns to step S1.

In step S2, the first detection unit 111 sets a charge end flag to 0. The charge end flag "1" indicates that the secondary battery 190 is not in the charging state, and the charge end flag "0" indicates that the secondary battery 190 is in the charging state. The charging state does not refer to a charging state in a narrow sense in which the charge current I2 is actually supplied to the secondary battery 190, but rather refers to a charging state in a broad sense from detection of connection of the charger 20 to the secondary battery 190 until measurement of the second OCV.

In step S3, the first detection unit 111 transmits a charge start notification to the charger 20 via the communication terminal 172. The charger 20, which has received the charge start notification, displays a message notifying start of charging on the display unit 230. In this manner, the user determines that charging of the secondary battery 190 has started.

In step S4, the first detection unit 111 acquires log data from the memory 120 and transmits the log data to the server 30 via the charger 20. Here, the transmitted log data is, for example, log data indicating a state of the secondary battery 190 periodically measured during discharging, log data indicating a state of the secondary battery 190 at the end of discharging, and the like. The transmitted log data is stored in the log database 321 by the server 30.

In step S5, the second necessity determination unit 315 of the server 30 determines whether or not the machine learning of the machine learning model 322 is completed. Here, when, for example, triggered by receiving of an inquiry notification for inquiring the server 30 whether or not learning of the machine learning model 322 has been completed from the battery pack 10, the second necessity determination unit 315 executes the determination of step S5.

In a case where the machine learning of the machine learning model 322 is determined to have been completed (YES in step S5), the processing proceeds to step S6. On the other hand, in a case where the machine learning of the machine learning model 322 is determined not to have been completed (NO in step S5), the processing proceeds to step S10.

In step S6, the first necessity determination unit 314 of the server 30 executes processing of determining whether or not the OCV acquisition mode is possible for determining whether or not execution of the OCV acquisition mode is possible. Details of the processing of determining whether or not the OCV acquisition mode is possible will be described later with reference to FIG. 7.

In step S7, in a case where a processing result of step S6 indicates that the execution of the OCV acquisition mode is possible (YES in step S7), the first necessity determination unit 314 advances the processing to step S8. On the other hand, in a case where a processing result of step S6 indicates that the execution of the OCV acquisition mode is not possible (NO in step S7), the first necessity determination unit 314 advances the processing to step S10. Note that the first necessity determination unit 314 transmits a determination result as to whether or not the execution of the OCV acquisition mode is possible to the battery pack 10 via the charger 20.

In step S8, the first determination unit 112 determines whether or not the secondary battery 190 has reached a stable state. In a case where the secondary battery 190 has reached a stable state (YES in step S8), the first measurement unit 113 measures the first OCV (step S9). On the other hand, in a case where the secondary battery 190 has not reached a stable state (NO in step S8), the processing returns to step S8.

In step S10, the instruction unit 114 turns on the switch 130. In step S11 shown in FIG. 6, the instruction unit 114 instructs the start of charging by transmitting a charge start command to the charger 20.

In step S12, the second detection unit 115 detects the end of charging of the secondary battery 190.

In step S13, in a case where a determination result of step S6 indicates that the execution of the OCV acquisition mode is possible (YES in step S13), the second determination unit 116 advances the processing to step S14. On the other hand, in a case where a processing result of step S6 indicates that the execution of the OCV acquisition mode is not possible (NO in step S3), the second determination unit 116 advances the processing to step S18.

In step S14, the second determination unit 116 determines whether or not the secondary battery 190 has reached a stable state. In a case where the secondary battery 190 has reached a stable state (YES in step S14), the second measurement unit 117 measures the second OCV (step S15). On the other hand, in a case where the secondary battery 190 has not reached a stable state (NO in step S14), the processing returns to step S14.

In step S16, the output unit 118 acquires log data from the memory 120. The log data acquired here is, for example, log data indicating a state of the secondary battery 190 periodically measured during charging.

In step S17, the output unit 118 transmits the log data acquired in step S16, log data including the first OCV, and log data including the second OCV to the server 30 via the charger 20.

In step S18, the first detection unit 111 sets a charge flag to "1". In step S19, the second measurement unit 117 causes the charger 20 to output a message notifying the end of charging.

Figure 7:
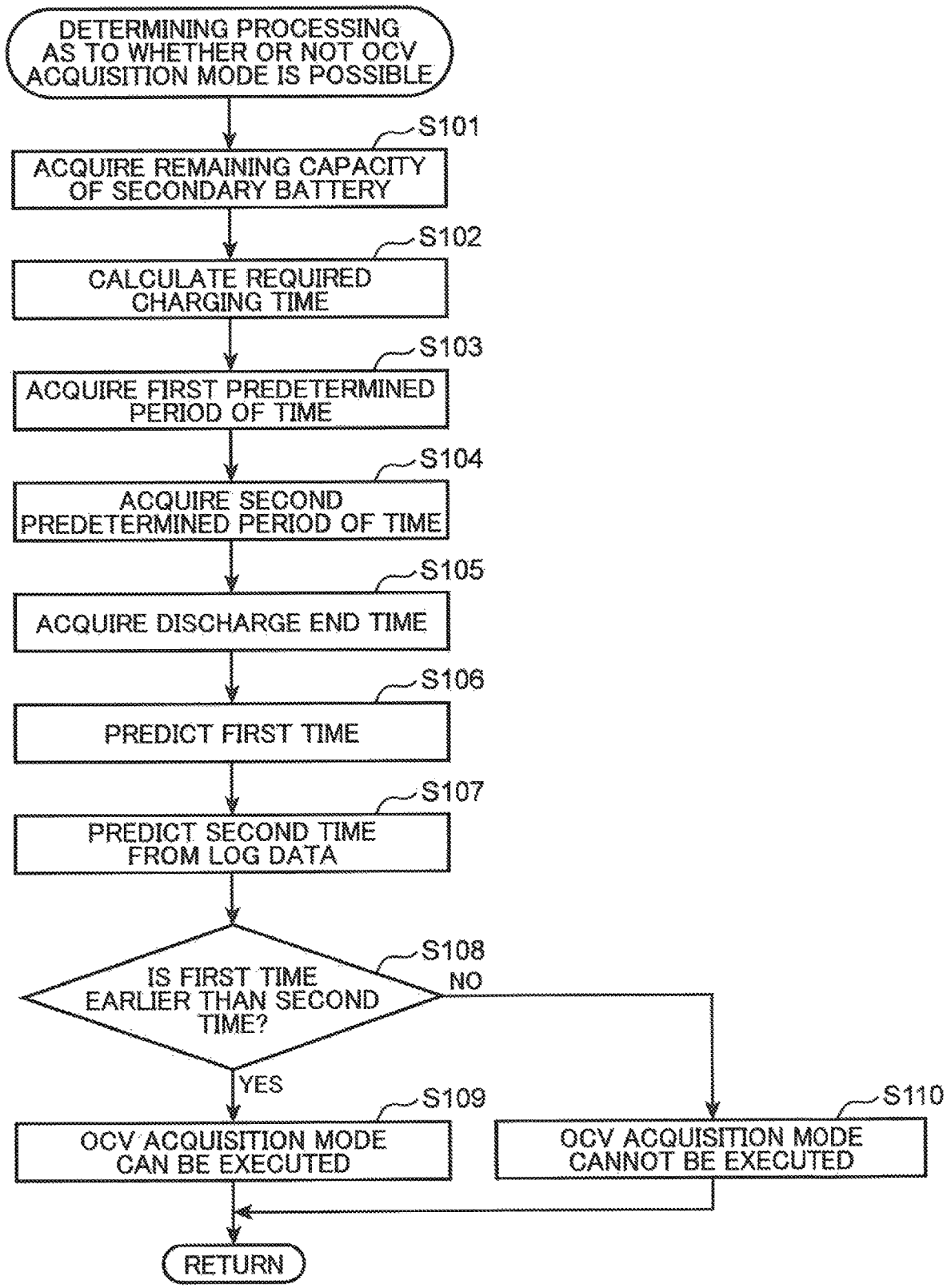
FIG. 7 is a flowchart showing an example of determining processing as to whether or not an OCV acquisition mode of FIG. 6 is possible.

FIG. 7 is a flowchart showing an example of determining processing as to whether or not the OCV acquisition mode of FIG. 6 is possible. In step S101, the first time prediction unit 312 acquires the remaining capacity of the secondary battery 190. Note that step S01 is started when the first time prediction unit 312 receives input of an instruction to calculate the first time from the first necessity determination unit 314 as a trigger. In step 3102, the first time prediction unit 312 calculates a required charging time required to fully charge the secondary battery 190 based on the obtained remaining capacity.

In step S103, the first time prediction unit 312 acquires the above-described first predetermined period of time from the memory 320. In step S104, the first time prediction unit 312 acquires the above-described second predetermined period of time from the memory 320. In step S105, the first time prediction unit 312 acquires the latest discharge end time of the target secondary battery 190 from the log database 321.

In step S106, the first time prediction unit 312 predicts a time obtained by adding the required charging time, the first predetermined period of time, and the second predetermined period of time to the discharge end time as the first time at which the measurement of the second OCV ends, and inputs the time to the first necessity determination unit 314. In step S107, the second time prediction unit 313 predicts the second time at which the user starts using the secondary battery 190 by the above-described processing. Note that step S107 is started when the second time prediction unit 313 receives input of an instruction to calculate the second time from the first necessity determination unit 314 as a trigger.

In step S108, the first necessity determination unit 314 determines whether or not the first time is earlier than the second time. If the first time is earlier than the second time (YES in step S108), the first necessity determination unit 314 determines that execution of the OCV acquisition mode is possible (step S109). On the other hand, if the first time is later than the second time (NO in step S108), the first necessity determination unit 314 determines that execution of the OCV acquisition mode is not possible (step S110).

As described above, in a case where the connection of the charger 20 is detected, the open circuit voltage measuring device according to the present embodiment does not immediately start charging, but waits until the state of the secondary battery 190 is stabilized (step S8) and then starts charging of the secondary battery 190 (step S11). Accordingly, the open circuit voltage measuring device can accurately measure the first OCV without making the user wait for the connection of the charger 20 until the state of the secondary battery 190 is stabilized.

Furthermore, in a case where the charging of the secondary battery 190 is completed, the open circuit voltage measuring device does not immediately notify the user of the completion of charging of the secondary battery 190, but notifies the user of the end of charging of the secondary battery 190 (step S19) after the state of the secondary battery 190 is stabilized (step S14). Accordingly, the open circuit voltage measuring device can suppress the user from starting to use the secondary battery 190 before the state of the secondary battery 190 is stabilized after the end of charging, and can accurately measure the second OCV. As described above, according to the present configuration, the OCV before and after charging can be accurately measured without causing stress to the user.

Furthermore, when reference is made to FIG. 5 and FIG. 6, in a case where execution of the OCV acquisition mode is determined to be not possible (NO in step S7), the open circuit voltage measuring device skips the processing of steps S8, S9, S14, S15, S16, and S17. For this reason, in a case where the first OCV and the second OCV do not need to be acquired, the open circuit voltage measuring device can quickly charge the secondary battery 190.

Furthermore, in FIG. 7, in a case where the first time is predicted to be before the second time, the execution of the OCV acquisition mode is determined to be not possible, and the open circuit voltage measuring device can prevent execution of the OCV acquisition mode for the user for whom the execution of the OCV acquisition mode does not match with the life cycle of the user.

Furthermore, since the open circuit voltage measuring device transmits the first OCV and the second OCV to the server 30, learning data useful for machine learning can be provided to the machine learning model 322.

Note that the present disclosure can employ a variation described below.

(1) In the above embodiment, main constituents of the open circuit voltage measuring device are included in the battery pack 10 and the server 30. However, the present disclosure is not limited to this, and all the main constituents may be included in the battery pack 10. For example, the first time prediction unit 312 to the second necessity determination unit 315 included in the processor 310 shown in FIG. 4 may be provided in the battery pack 10.

(2) The server 30 may include all main constituents of the open circuit voltage measuring device. For example, the server 30 may include the first detection unit 111 to the output unit 118 shown in FIG. 2. In this case, the battery pack 10 has a function of transmitting sensing data of the connection sensor 173 to the server 30, a function of sequentially transmitting a voltage and a current of the secondary battery 190 to the server 30, and a function of measuring the first OCV and the second OCV according to an instruction from the server 30 and transmitting them to the server 30.

(3) Although the battery pack 10 is mounted on a vehicle, the present disclosure is not limited to this, and the battery pack 10 may be applied to a mobile terminal such as a smartphone or a tablet terminal. In this case, a charger of a mobile terminal is employed as the charger 20.

(4) In FIG. 6, the first OCV is output in step S17. However, this is an example, and, in the present disclosure, the first OCV may be output at the time of measurement of the first OCV shown in step S9.

This application is based on Japanese Patent application No. 2019-105876 filed in Japan Patent Office on Jun. 6, 2019, the contents of which are hereby incorporated by reference.

INDUSTRIAL APPLICABILITY

The present disclosure is useful for an electric vehicle and a mobile terminal because an open circuit voltage can be measured without causing stress to the user.

The invention claimed is:

1. An open circuit voltage measuring method in an open circuit voltage measuring device that measures an open circuit voltage of a secondary battery, the method comprising:
   (a) detecting connection between the secondary battery and a charger;
   (b) determining whether or not a state of the secondary battery is stabilized in a case of detecting the connection;
   (c) measuring a first open circuit voltage that is an open circuit voltage before charging of the secondary battery in a case of determining that a state of the secondary battery is stabilized;
   (d) instructing the charger to start charging of the secondary battery;
   (e) detecting end of charging of the secondary battery;
   (f) determining whether or not a state of the secondary battery is stabilized in a case of detecting end of charging of the secondary battery;
   (g) measuring a second open circuit voltage that is an open circuit voltage after charging of the secondary battery in a case of determining that a state of the secondary battery is stabilized; and
   (h) notifying a user of the secondary battery of end of charging of the secondary battery.

2. The open circuit voltage measuring method according to claim 1, further comprising:
   predicting a first time at which the measurement of the second open circuit voltage shown in (g) ends based on remaining capacity of the secondary battery in a case of detecting connection between the charger and the secondary battery;
   acquiring a use history of the user for the secondary battery;
   predicting a second time at which the user starts using the secondary battery after detecting connection to the charger based on the use history; and
   executing the processing of the steps (b), (c), (f), (g), and (h) in a case where the first time is earlier than the second time.

3. The open circuit voltage measuring method according to claim 1,
   wherein the first open circuit voltage and the second open circuit voltage are used for learning a predetermined machine learning model, and
   the processing of (b), (c), (f), (g), and (h) is executed until learning of the machine learning model ends.

4. The open circuit voltage measuring method according to claim 1, further comprising:
   outputting the first open circuit voltage and the second open circuit voltage.

5. The open circuit voltage measuring method according to claim 1,
   wherein a state of the secondary battery is determined to be stabilized in a case where a first predetermined period of time has elapsed since end of discharging of the secondary battery is detected in (b), and
   a state of the secondary battery is determined to be stabilized in a case where a second predetermined period of time has elapsed since end of charging of the secondary battery is detected in (f).

6. The open circuit voltage measuring method according to claim 1,
   wherein a state of the secondary battery is determined to be stabilized in a case where a voltage change of the secondary battery is equal to or less than a voltage threshold in (b) and (f).

7. The open circuit voltage measuring method according to claim 1,
   wherein the charger starts supplying power to the secondary battery in a case where the instruction to start charging is performed in (d).

8. The open circuit voltage measuring method according to claim 1,
   wherein the secondary battery is mounted on an electric vehicle.

9. An open circuit voltage measuring device that measures an open circuit voltage of a secondary battery, the device comprising:
   a first detector that detects connection between the secondary battery and a charger;
   a first determiner that determines whether or not a state of the secondary battery is stabilized in a case where the first detector detects the connection;
   a first measurer that measures a first open circuit voltage that is an open circuit voltage before charging of the secondary battery in a case where the first determiner determines that a state of the secondary battery is stabilized;
   an instructor that instructs the charger to start charging of the secondary battery;
   a second detector that detects end of charging of the secondary battery;
   a second determiner that determines whether or not a state of the secondary battery is stabilized in a case where the second detector detects end of charging of the secondary battery; and
   a second measurer that measures a second open circuit voltage that is an open circuit voltage after charging of the secondary battery in a case where the second determiner determines that a state of the secondary battery is stabilized, and then notifies a user of the secondary battery of end of charging of the secondary battery.

10. A non-transitory computer-readable recording medium that records a program that causes a computer to function as an open circuit voltage measuring device that measures an open circuit voltage of a secondary battery, the recording medium causing the computer to function as:
- a first detector that detects connection between the secondary battery and a charger;
- a first determiner that determines whether or not a state of the secondary battery is stabilized in a case where the first detector detects the connection;
- a first measurer that measures a first open circuit voltage that is an open circuit voltage before charging of the secondary battery in a case where the first determiner determines that a state of the secondary battery is stabilized;
- an instructor that instructs the charger to start charging of the secondary battery;
- a second detector that detects end of charging of the secondary battery;
- a second determiner that determines whether or not a state of the secondary battery is stabilized in a case where the second detector detects end of charging of the secondary battery; and
- a second measurer that measures a second open circuit voltage that is an open circuit voltage after charging of the secondary battery in a case where the second determiner determines that a state of the secondary battery is stabilized, and then notifies a user of the secondary battery of end of charging of the secondary battery.

* * * * *